United States Patent [19]

Opara

[11] 4,307,611
[45] Dec. 29, 1981

[54] PULSE-ECHO ULTRASONIC APPARATUS

[75] Inventor: Ulrich Opara, Erftstadt-Köttingen, Fed. Rep. of Germany

[73] Assignee: Krautkramer-Branson, Inc., Stratford, Conn.

[21] Appl. No.: 159,056

[22] Filed: Jun. 13, 1980

[30] Foreign Application Priority Data

Jun. 25, 1979 [DE] Fed. Rep. of Germany ....... 2925522

[51] Int. Cl.³ ............................................. G01N 29/00
[52] U.S. Cl. ......................................... 73/597; 73/629
[58] Field of Search .................. 73/597, 611, 627, 629

[56] References Cited

U.S. PATENT DOCUMENTS 3,985,022 10/1976 Dileo ..................................... 73/629
3,994,154 11/1976 Niklas et al. .......................... 73/597
4,114,455 9/1978 Walker ................................... 73/597

Primary Examiner—Stephen A. Kreitman
Attorney, Agent, or Firm—Ervin B. Steinberg; Philip J. Feig

[57] ABSTRACT

An ultrasonic thickness measuring apparatus comprises means for developing pulse counts responsive to the transit time of the ultrasonic search signal traversing the workpiece. The accumulated pulse count is displayed after each transit time interval and is used also to derive a correction factor which is inserted into the counter accumulating the counts during each time interval. This arrangement provides for the apparatus to almost immediately display a thickness value which nearly coincides with the final measurement value.

4 Claims, 3 Drawing Figures

PULSE-ECHO ULTRASONIC APPARATUS

SUMMARY OF THE INVENTION

This invention generally refers to an apparatus for digitally measuring analog quantities wherein the digitized quantity is determined by providing sequential timing intervals and the pulse count provided by a high frequency clock during the respective time intervals is measured. Quite specifically, this invention concerns an instrument for measuring the thickness of a workpiece utilizing the ultrasonic pulse echo method.

Measuring the thickness of a workpiece by ultrasonic energy is well known. The general measurement method comprises the steps of coupling an ultrasonic transmit-receive probe to the surface of the workpiece, periodically transmitting an ultrasonic search pulse into the workpiece and subsequently receiving echo responsive pulses produced as a respective search pulse encounters the entrant surface and the rear surface of the workpiece. A timing circuit is started responsive to the receipt of the entrant surface responsive echo-pulse and is terminated upon receipt of the rear surface responsive echo-pulse. The time interval between the receipt of the two mentioned pulses, i.e. the width of the produced time gate, is responsive to the workpiece thickness.

The method and circuit for determining the workpiece thickness value by timing the gate width is shown and described, for instance, in U.S. Pat. No. 3,985,022. The known method requires the measurement of the quantity of pulses accumulated during successive gate intervals and then forming an average value thereof. Typically, the number of time intervals used for deriving an average value is greater than four hundred. Such a high number necessitates that the workpiece be coupled to the measuring apparatus for a relatively long period of time. Additionally, a relatively long time period is required until a readout of the measured value occurs. Thus, rapid dynamic changes in the value (dimension) of the workpiece to be measured cannot be displayed in a timely manner.

The basis of the present invention, therefore, lies in the feature that a readout value $A_{i+1}$ (defined below) is displayed at the end of each timing interval rather than displaying a readout value only after determining the quantity of pulses from a predetermined number of timing intervals. Each time interval, in accordance with the present invention, results in a value $A_{i+1}$ which is given by the formula:

$$A_{i+1} = A_i + (N_{i+1} - A_i/c) \quad (1)$$

wherein $N_{i+1}$ represents the quantity of pulses which varies randomly around a mean value in the $i+1$ time interval, and wherein c is a constant greater than unity for which the following relationship applies:

$$c > \left( \frac{\text{accuracy of dimension measured during one transit time interval in units of length}}{\text{desired accuracy of dimension to be determined units of length}} \right)^2 \quad (2)$$

The above indicated measuring process is advantageously put to use if the timing intervals are selected to be relatively short in relation to the pulse repetition rate of the measuring apparatus.

Though the initial successive readout values $A_1$, $A_2$, ... are relatively inaccurate approximations of the measured value, nevertheless, they will provide an indication of the order of magnitude of the dimension to be determined. In addition, the longer the workpiece, and hence the dimension to be determined, is coupled to the transmit-receive probe of the ultrasonic thickness meter apparatus the more accurate the readout value will become. Such accuracy is attained because with each respective new determination of the measured value the preceding measured value is taken into consideration. To a large extent, therefore, the operator of the thickness measuring apparatus can choose the accuracy of the readout value depending upon the quantity of time intervals utilized. After a number of measurements equal to the constant c, a readout value of the measured thickness is displayed which corresponds to the value obtained by the known average value method, see U.S. Pat. No. 3,985,022.

The constant c has the meaning of a damping constant which is apparent after rewriting the equation (1):

$$\Delta A_i = A_{i+1} - A_i = N_{i+1} - A_i/c$$

from which the approximation follows:

$$dA/dt + A/c = \dot{N}$$

with the solution:

$$A = c \cdot \dot{N} \left( 1 - e^{\frac{-(t-t_0)}{c}} \right)$$

Therefore, the readout value A exponentially approaches a result corresponding to that obtained by the known average value method. The rate of damping is given by the selection of the constant c.

A principal object of this invention, therefore, is the provision of an apparatus for measuring analog quantities which does not require the analog quantity to be measured for a relatively long time period in comparison to the known method and circuit.

Another principal object of this invention is the provision of an ultrasonic thickness measuring apparatus which eliminates the relatively long period of time required before a thickness measurement reading is displayed.

Further and still other objects of this invention will become apparent when the following description is read in conjunction with the accompanying drawings.

DETAILED DESCRIPTION OF THE INVENTION

Figure 1:
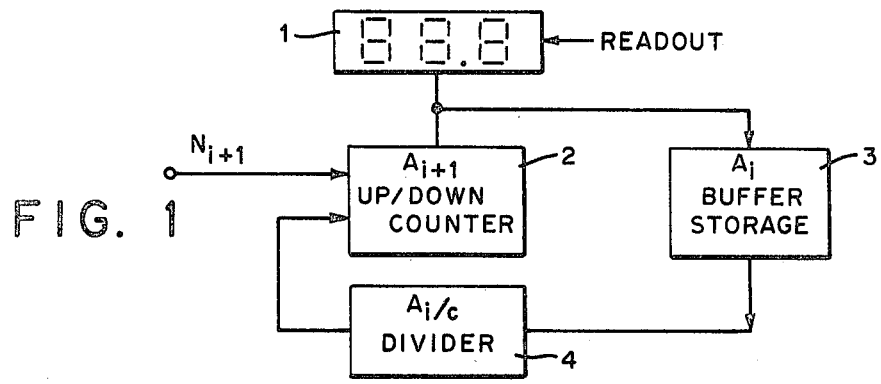
FIG. 1 is a schematic block diagram of a circuit for carrying out the method in accordance with the invention.

Referring now to the figures and FIG. 1 in particular, there is shown a schematic block diagram of a preferred embodiment of the invention. The circuit, which for example may be used for measuring frequencies, consists of a readout device 1, an up/down counter 2, a temporary memory (buffer storage) 3, and a divider 4.

The processing of the incoming quantity of pulses is performed cyclically with the aid of a cycle control unit (not shown). Such cycle control units are known and available to those skilled in the art. During a first cycle, the new incoming quantity of pulses $N_{i+1}$ is stored in the up/down counter 2 so that this counter has the digital value $A_i + N_{i+1}$. This digital value is corrected during a second cycle whereby, from the memory of divider 4, the value $A_i/c$ is read out which causes the counter 2 to count down. Finally, during a third cycle, the value $A_{i+1} = A_i + N_{i+1} - A_i/c$ is read out of counter 2 and is routed to the readout device 1 and also to the divder 4 via the temporary memory 3. Thereafer, the next value $N_{i+2}$ can then be fed into counter 2.

As previously mentioned, the constant c is a damping constant which divides the respective value entered into the divider 4. The larger the selected value of c, the slower the convergence of the respective readout values $A_i$, $A_{i+1}$ ... in the direction of the actual value of the quantity which is to be determined. As a rule, constant c is selected in accordance with the previously stated relationship of equation (2) so that the time period until a readout value is displayed is kept as short as possible.

As is the case with typical dividers, it is not possible, with a justifiable expenditure, to realize the expression $A_i/c$ with any chosen accuracy. In circuit practice, one frequently proceeds from the expression $$(1/10^n) \text{Integer} 10^n A_i/c.$$

Integer $10^n A_i/c$ is defined as the integer portion of the quotient $10^n A_i/c$; the value of n is chosen so that the number of positions following the decimal point of the expression $A_i/c$ is considered in the statistical average.

Figure 2:
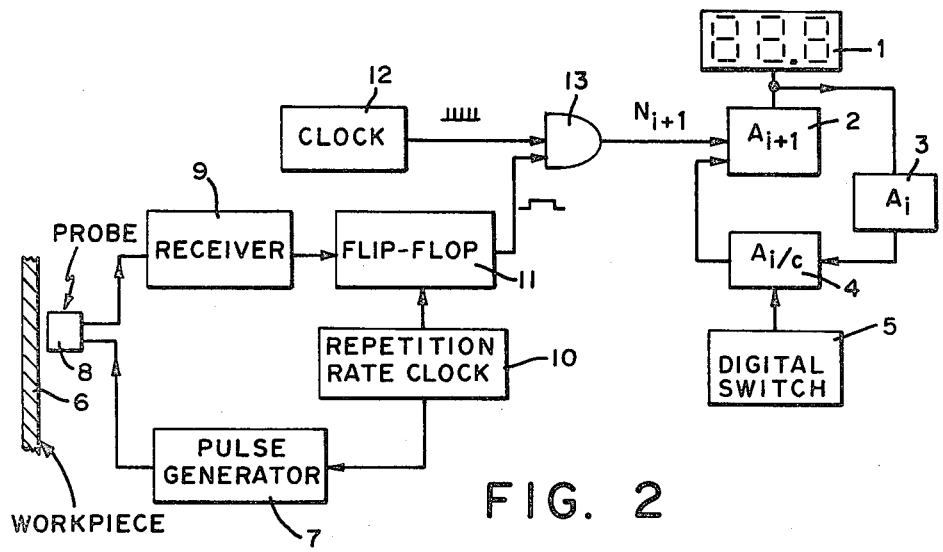
FIG. 2 is an electrical schematic block diagram of an ultrasonic thickness meter which employs the circuit in accordance with FIG. 1.

The above described method has proven itself to be particularly advantageous in conjunction with the ultrasonic thickness meter illustrated in FIG. 2. Those elements which are also shown in FIG. 1 have been given the same reference designations. In this case, however, the constant c not only has the significance of a damping constant but also has been chosen so that it is proportional to the velocity of sound within the workpiece 6. The result is that the readout value in the steady state condition $(A_i = A_{i+1})$ becomes independent of the acoustic velocity v of the workpiece 6.

Since per equation (1) for the latter condition stated $A_i \sim v N_i$ and in general $N_i = 2df/v$ wherein d is the thickness of the workpiece and f the pulse repetition frequency of the clock 12 (FIG. 2), it follows that $A_i \sim 2df$ and, hence, is independent of the velocity v.

If the workpiece is changed to a material with a different acoustic velocity (e.g. aluminum instead of steel), it is necessary only to adjust the value c so that it corresponds to the value of the acoustic velocity of the new workpiece. This may be accomplished, for example, by means of a digital switch 5.

The ultrasonic thickness meter shown in FIG. 2 comprises a pulse generator 7, a transmit-receive probe 8, a receiver 9, a repetition rate clock 10, a flip-flop circuit 11, a high frequency clock 12 and an AND gate 13. These components are shown in the ultrasonic thickness meter disclosed in U.S. Pat. No. 3,985,022 and, therefore, need not be described in detail.

The clock 10 cyclically provides timing pulses, typically at a frequency in the range between 500 Hz and 20 kHz, to the pulse generator 7 for cyclically energizing the transmit-receive probe 8. The transmit-receive probe 8, responsive to the electrical signal from the pulse generator 7, periodically transmits an ultrasonic search signal into the workpiece 6 whose thickness is to be measured and receives echo responsive pulses. These echo responsive pulses are converted by the probe to electrical signals and fed to a receiver circuit 9 which provides echo responsive trigger signals to the timing flip-flop 11 for generating a thickness responsive timing gate signal which corresponds to the transit time of a respective search pulse through the workpiece.

The clock 12 provides a train of pulses to the AND gate circuit 13 at a predetermined frequency. The timing signal from the flip-flop 11 causes the gate circuit 13 to be open for a time interval commensurate with the width of the timing signal which corresponds to the thickness of the workpiece 6.

The up/down counter 2 receives the counts from clock 12 during the time interval in which the gate 13 is open (transit time of ultrasonic signal in workpiece 6). As previously stated, the accumulated count in counter 2 developed during each transit time interval is displayed at the read-out device 1, and is provided also to the buffer storage 3, and transferred to the divider 4 wherein it is divided by the factor c provided by digital switch 5. The result of this division is fed back as a correction count to the up/down counter 2 causing adjustment of the latter.

Figure 3:
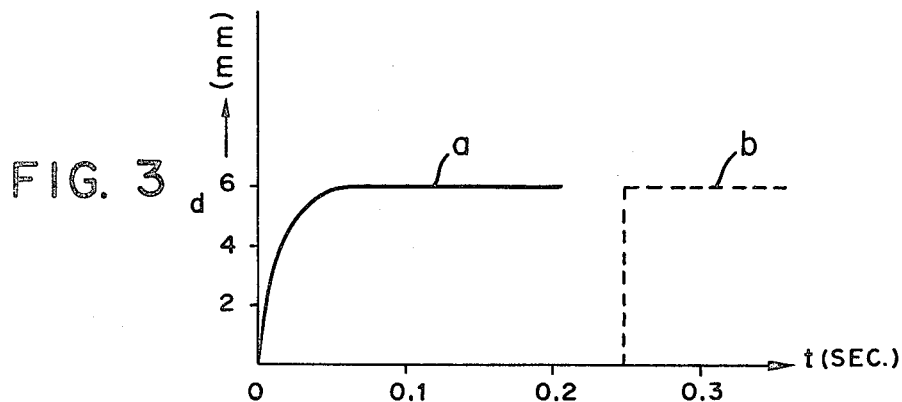
FIG. 3 is a graphic presentation of the time sequence of the thickness measurement readings for the circuit displayed in FIG. 2 (curve a) and for a circuit utilizing the known average value method (curve b).

FIG. 3 (curve a) is a graph of the measurement readings d achieved with a thickness meter as shown in FIG. 2. The frequency of the clock 12 is 5 MHz whereas the frequency with which the time intervals are repeated is 2.5 kHz. The workpiece 6 is a six mm thick steel plate (v = 5920 m/sec). Since the accuracy of the measured value determined in one time interval is about ±0.3 mm and the desired accuracy of the read-out should be about ±0.1 mm, the constant c must be larger than nine. Because of the requirement c~v, it follows, for example, that $c = 592/10 \approx 60$. The averaging procedure occurs over approximately 60 time intervals and yields an accuracy of better than 0.1 mm. For equilibrium the condition $A_i = 100 \cdot d$ applies.

Whereas with the method and circuit previously described a readout value is displayed after 0.25 to 0.5 seconds (curve b, FIG. 3), the present invention displays a readout value after only 0.05 seconds (curve a, FIG. 3) and such value already agrees quite well with the actual thickness value.

While there has been described and illustrated a preferred embodiment of the present invention, it will be apparent to those skilled in the art that modifications and changes may be made without departing from the broad principle of this invention which shall be limited only by the scope of the appended claims.

What is claimed is:

1. An apparatus for measuring the dimension of a workpiece which includes circuit means for periodically transmitting an ultrasonic search pulse into the workpiece and subsequently receiving an echo pulse responsive to the search pulse intercepting an acoustic impedance change, means coupled to said circuit for providing counts commensurate with the transit time of the search pulse traversing the workpiece dimension as determined by a first signal responsive to the transmitting of the search pulse and a second signal responsive to the receipt of the echo pulse, the improvement comprising:

counting means coupled for receiving the counts responsive to each transit time and accumulating such counts to provide a transit time responsive count;

a feedback circuit comprising a buffer storage and a divider circuit coupled to said counting means for receiving each transit time responsive count and dividing it by a value c to thereby derive a corrective count and feeding the corrective count to said counting means for updating said transit time responsive count of said counting means, and display means coupled for periodically displaying a value responsive to said updated count of said counting means, the value c being selected to be greater than the squared ratio of the accuracy of the dimension measured during one transit time interval in units of length to the desired accuracy of the dimension to be determined in units of length.

2. An apparatus as set forth in claim 1, said counting means being an up-down digital counter.

3. An apparatus as set forth in claim 1, said display means displaying an updated count for each transit time interval.

4. An apparatus as set forth in claim 1, said value c being commensurate with the acoustic velocity of the workpiece.

* * * * *